(12) United States Patent
Ji (10) Patent No.: US 11,854,633 B2
(45) Date of Patent: Dec. 26, 2023

(54) ANTI-FUSE MEMORY CELL STATE DETECTION CIRCUIT AND MEMORY

(71) Applicant: CHANGXIN MEMORY TECHNOLOGIES, INC., Hefei (CN)

(72) Inventor: Rumin Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 183 days.

(21) Appl. No.: 17/446,289

(22) Filed: Aug. 27, 2021

(65) Prior Publication Data

US 2022/0020443 A1 Jan. 20, 2022

Related U.S. Application Data (63) Continuation of application No. PCT/CN2021/100976, filed on Jun. 18, 2021.

(30) Foreign Application Priority Data

Jul. 16, 2020 (CN) .......................... 202010687642.9

(51) Int. Cl.
  *G11C 17/00* (2006.01)
  *G11C 17/18* (2006.01)
  (Continued)

(52) U.S. Cl.
  CPC .......... *G11C 17/18* (2013.01); *G11C 11/4074* (2013.01); *G11C 11/4085* (2013.01); *G11C 11/4094* (2013.01); *G11C 17/16* (2013.01)

(58) Field of Classification Search
  CPC . G11C 17/18; G11C 11/4074; G11C 11/4085; G11C 11/4094; G11C 17/16; G11C 16/32
  See application file for complete search history.

(56) References Cited

U.S. PATENT DOCUMENTS

| 7,082,061 B2 | 7/2006 | Chou |
| 7,333,383 B2 | 2/2008 | Vogelsang |

(Continued)

FOREIGN PATENT DOCUMENTS

| CN | 1828764 A | 9/2006 |
| CN | 100483540 C | 4/2009 |

(Continued)

OTHER PUBLICATIONS

Translation (NPL) of International Preliminary Report on Patentability, PCT/CN2021/100976, dated Jan. 17, 2023 (Year: 2023).*

(Continued)

*Primary Examiner* — Mushfique Siddique
(74) *Attorney, Agent, or Firm* — SYNCODA LLC; Feng Ma (57) ABSTRACT

A state detection circuit of an anti-fuse memory cell includes a first switching element, having a first end connected to a power supply, a second end connected to a first node, and a control end connected to a controller; an anti-fuse memory cell array including a plurality of anti-fuse memory cell sub-arrays, bit lines of the plurality of anti-fuse memory cell sub-arrays being all connected to the first node, and word lines of the plurality of anti-fuse memory cell sub-arrays being all connected to the controller; and a comparator, having a first input end connected to the first node, and a second input end connected to a reference voltage.

11 Claims, 12 Drawing Sheets

(51) Int. Cl.
  *G11C 17/16* (2006.01)
  *G11C 11/4074* (2006.01)
  *G11C 11/408* (2006.01)
  *G11C 11/4094* (2006.01)

(56) References Cited

U.S. PATENT DOCUMENTS

| | | |
|---|---|---|
| 8,208,336 B2 | 6/2012 | Do |
| 8,243,542 B2 | 8/2012 | Bae |
| 8,654,595 B2 | 2/2014 | Kim |
| 9,099,191 B2 | 8/2015 | Tsai et al. |
| 9,330,781 B2 | 5/2016 | Kim et al. |
| 9,564,235 B2 | 2/2017 | Zhou et al. |
| 10,121,537 B2 | 11/2018 | Rho |
| 10,403,344 B2 | 9/2019 | Lee |
| 10,446,204 B2 | 10/2019 | Inaba |
| 10,459,693 B2 | 10/2019 | Lin et al. |
| 10,658,048 B2 | 5/2020 | Conte et al. |
| 10,693,369 B2 | 6/2020 | Ku et al. |
| 2006/0120174 A1 | 6/2006 | Chou |
| 2007/0053236 A1* | 3/2007 | Vogelsang ....... G11C 29/50008 365/96 |
| 2010/0118595 A1 | 5/2010 | Bae |
| 2010/0277999 A1 | 11/2010 | Do |
| 2013/0064008 A1 | 3/2013 | Kim |
| 2014/0140160 A1* | 5/2014 | Nishioka ............ G11C 13/0002 365/225.7 |
| 2014/0355353 A1 | 12/2014 | Tsai et al. |
| 2015/0078081 A1 | 3/2015 | Zhou et al. |
| 2015/0287475 A1 | 10/2015 | Kim et al. |
| 2018/0158523 A1 | 6/2018 | Rho |
| 2018/0197590 A1 | 7/2018 | Lee |
| 2018/0277182 A1 | 9/2018 | Inaba |
| 2019/0114144 A1 | 4/2019 | Lin et al. |
| 2019/0369966 A1 | 12/2019 | Hsu |
| 2019/0372456 A1 | 12/2019 | Ku et al. |
| 2020/0058360 A1 | 2/2020 | Conte et al. |
| 2022/0020442 A1* | 1/2022 | Ji .......................... G11C 17/16 |
| 2022/0130448 A1* | 4/2022 | Ji ........................ G11C 11/4091 |

FOREIGN PATENT DOCUMENTS

| | | |
|---|---|---|
| CN | 101916583 A | 12/2010 |
| CN | 103366790 A | 10/2013 |
| CN | 104217744 A | 12/2014 |
| CN | 104505123 A | 4/2015 |
| CN | 104505123 B | 4/2018 |
| CN | 108154894 A | 6/2018 |
| CN | 108288479 A | 7/2018 |
| CN | 108630265 A | 10/2018 |
| CN | 109671457 A | 4/2019 |
| CN | 109799374 A | 5/2019 |
| CN | 105913876 B | 10/2019 |
| CN | 110544500 A | 12/2019 |
| CN | 110838309 A | 2/2020 |
| CN | 210639992 U | 5/2020 |
| CN | 210925501 U | 7/2020 |
| JP | 2001319488 A | 11/2001 |

OTHER PUBLICATIONS

International Search Report in the international application No. PCT/CN2021/097868, dated Aug. 26, 2021.
International Search Report in the international application No. PCT/CN2021/100976, dated Sep. 1, 2021.
International Search Report in the international application No. PCT/CN2021/097849, dated Aug. 26, 2021.
International Search Report in the international application No. PCT/CN2021/097918, dated Jul. 26, 2021.

* cited by examiner

ANTI-FUSE MEMORY CELL STATE DETECTION CIRCUIT AND MEMORY

CROSS-REFERENCE TO RELATED APPLICATIONS

This is a continuation of International Patent Application No. PCT/CN2021/100976 filed on Jun. 18, 2021, which claims priority to China Patent Application No. 202010687642.9 filed on Jul. 16, 2020. The disclosures of these applications are hereby incorporated by reference in their entirety.

BACKGROUND

Figure 1:
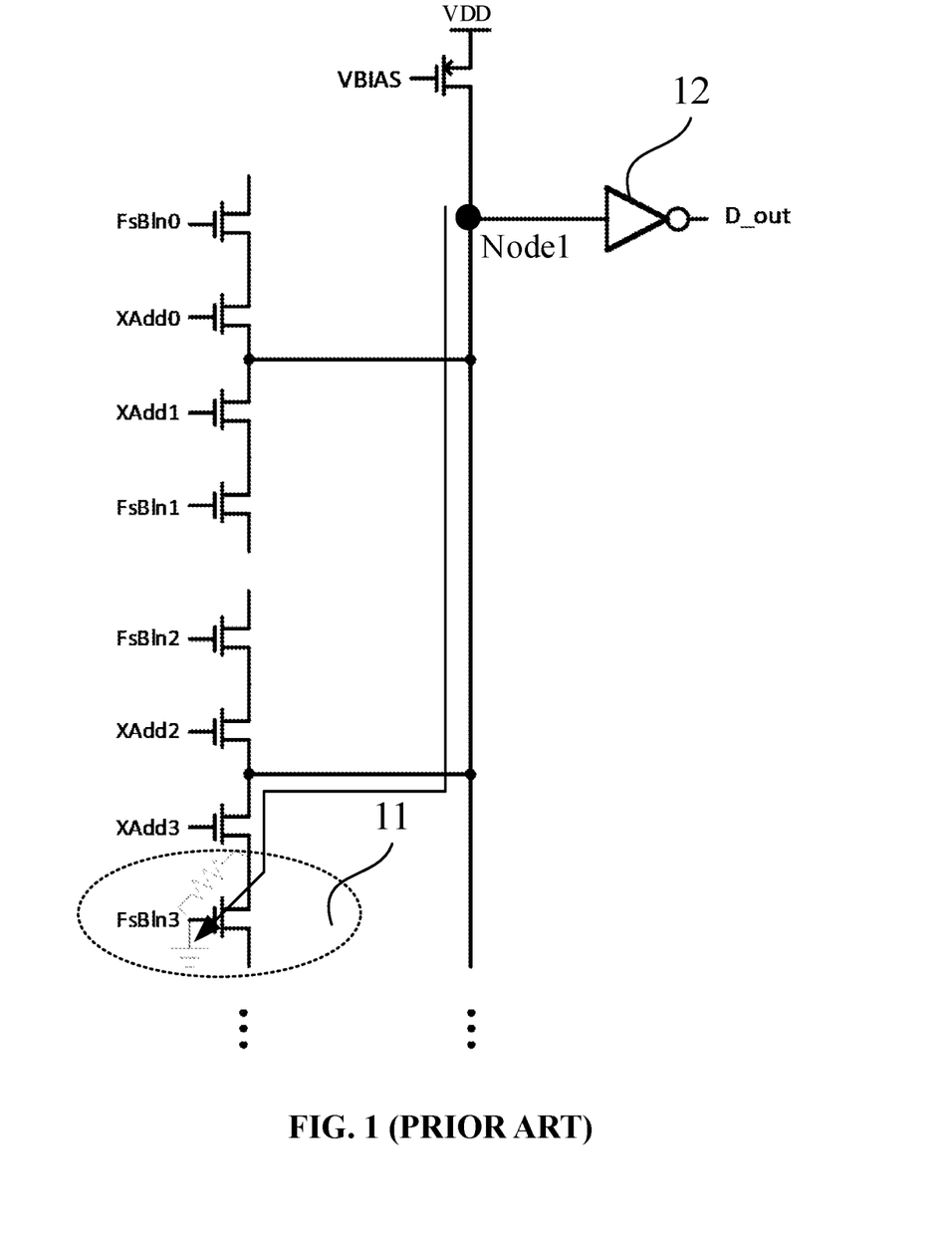
FIG. 1 is a schematic diagram of a state detection circuit of an anti-fuse memory cell in existing technologies.

A storage state of an anti-fuse memory cell is usually detected by a simple logic gate circuit in existing technologies. Referring to FIG. 1, an anti-fuse memory cell 11 with a word line connected to an FsBlin3 signal is taken as an example: if the anti-fuse memory cell is burnt during programming, the anti-fuse memory cell changes from a non-storage state to a storage state. A passage resistance is reduced to a small value (tens of thousands of ohms to hundreds of thousands of ohms). When the anti-fuse memory cell is selected, an passage current flows through an equivalent resistance in the storage state, and a relatively low voltage value is generated on Node 1, such that an output signal D_out of a logic gate 12 is at a high level. On the contrary, if the anti-fuse memory cell is not burnt during programming, the equivalent resistance of the anti-fuse memory cell in a passage will be relatively large (several megaohms to hundreds of megaohms), then a voltage drop generated by a fixed circuit on the passage will exceed a flip point of the logic gate 12, making the output signal D_out of the logic gate 12 at a low level.

It should be noted that the information disclosed in the background art section above is only used to enhance the understanding of the background of the disclosure, and therefore may include information that does not constitute the existing technology known to those of ordinary skill in the art.

SUMMARY

The disclosure relates generally to the technical field of integrated circuits, and more specifically to a state detection circuit of an anti-fuse memory cell and a memory applying the circuit.

The disclosure provides a state detection circuit of an anti-fuse memory cell and a memory applying the same, which are used to overcome the inaccurate detection result of the storage state of the anti-fuse memory cell due to the limitations and defects of the related technology at least to a certain extent.

According to one aspect of the disclosure, a state detection circuit of an anti-fuse memory cell is provided, including a first switching element, having a first end connected to a power supply, a second end connected to a first node, and a control end connected to a controller; an anti-fuse memory cell array including a plurality of anti-fuse memory cell sub-arrays, bit lines of the plurality of anti-fuse memory cell sub-arrays being all connected to the first node, and word lines of the plurality of anti-fuse memory cell sub-arrays being all connected to the controller; and a comparator, having a first input end connected to the first node and a second input end connected to a reference voltage. The anti-fuse memory cell sub-array includes a plurality of anti-fuse memory cells. The controller detects states of the plurality of anti-fuse memory cells one by one by switching on or off the first switching element.

It should be understood that the above general description and the following detailed description are exemplary and explanatory only, and are not intended to limit the disclosure.

BRIEF DESCRIPTION OF THE DRAWINGS

The accompanying drawings, which are incorporated in and constitute a part of this specification, illustrate embodiments consistent with the disclosure and, together with the specification, serve to explain the principles of the disclosure. Apparently, the drawings in the following description are only some embodiments of the disclosure. Those of ordinary skill in the art can further obtain other drawings based on these drawings without creative work.

DETAILED DESCRIPTION

Example implementation modes will be now described more comprehensively with reference to the accompanying drawings. However, the example implementation modes can be embodied in a variety of forms and should not be construed as being limited to the examples set forth herein. Rather, these implementation modes are provided to make the disclosure more comprehensive and complete, and fully convey the concept of the exemplary implementation modes to those skilled in the art. The features, structures or characteristics described may be combined in one or more implementation modes in any proper approach. In the following description, many specific details are provided to give a sufficient understanding of the implementation modes of the disclosure. However, those skilled in the art will realize that the technical solutions of the disclosure can be practiced without one or more of the specific details, or other methods, components, devices, steps, etc. can be used. In other cases, the well-known technical solutions are not shown or described in detail to avoid distraction and obscuring of all aspects of the disclosure.

In addition, the drawings are only schematic illustrations of the disclosure, and the same reference signs in the drawings denote the same or similar parts, and thus their repeated descriptions will be omitted. Some of the block diagrams shown in the drawings are functional entities and do not necessarily correspond to physically or logically independent entities. These functional entities may be implemented in the form of software, or implemented in one or more hardware modules or integrated circuits, or implemented in different networks and/or processor devices and/or microcontroller devices.

Exemplary implementation modes of the disclosure will be described in detail below with reference to the accompanying drawings.

In actual production, the resistance of the anti-fuse memory cell in the non-storage state usually fluctuates within a relatively wide range. Changes in factors such as process, voltage, and temperature will also cause the flip point of the logic gate circuit to change within a relatively wide range. These factors may cause errors in detection of a storage state of the anti-fuse memory cell. For example, a burnt anti-fuse memory cell is mistakenly determined as an unburned anti-fuse memory cell, or an unburned anti-fuse memory cell is mistakenly determined as a burnt anti-fuse memory cell, resulting in a decrease in yield.

Figure 2:
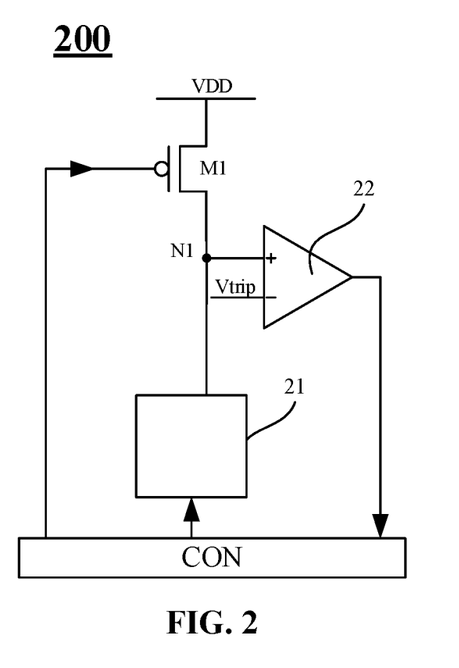
FIG. 2 is a schematic structural diagram of a state detection circuit of an anti-fuse memory cell in example embodiments of the disclosure.

FIG. 2 is a schematic structural diagram of an anti-fuse memory cell state detection circuit in the exemplary embodiments of the disclosure.

Referring to FIG. 2, a state detection circuit of an anti-fuse memory cell 200 can include:

a first switching element M1, having a first end connected to a power supply VDD, a second end connected to a first node N1, and a control end connected to a controller CON;

an anti-fuse memory cell array 21 including a plurality of anti-fuse memory cell sub-arrays, bit lines of the plurality of anti-fuse memory cell sub-arrays being all connected to the first node N1, and word lines of the plurality of anti-fuse memory cell sub-arrays being all connected to the controller CON; and a comparator 22, having a first input end connected to the first node N1 and a second input end connected to a reference voltage Vtrip.

Figure 9:
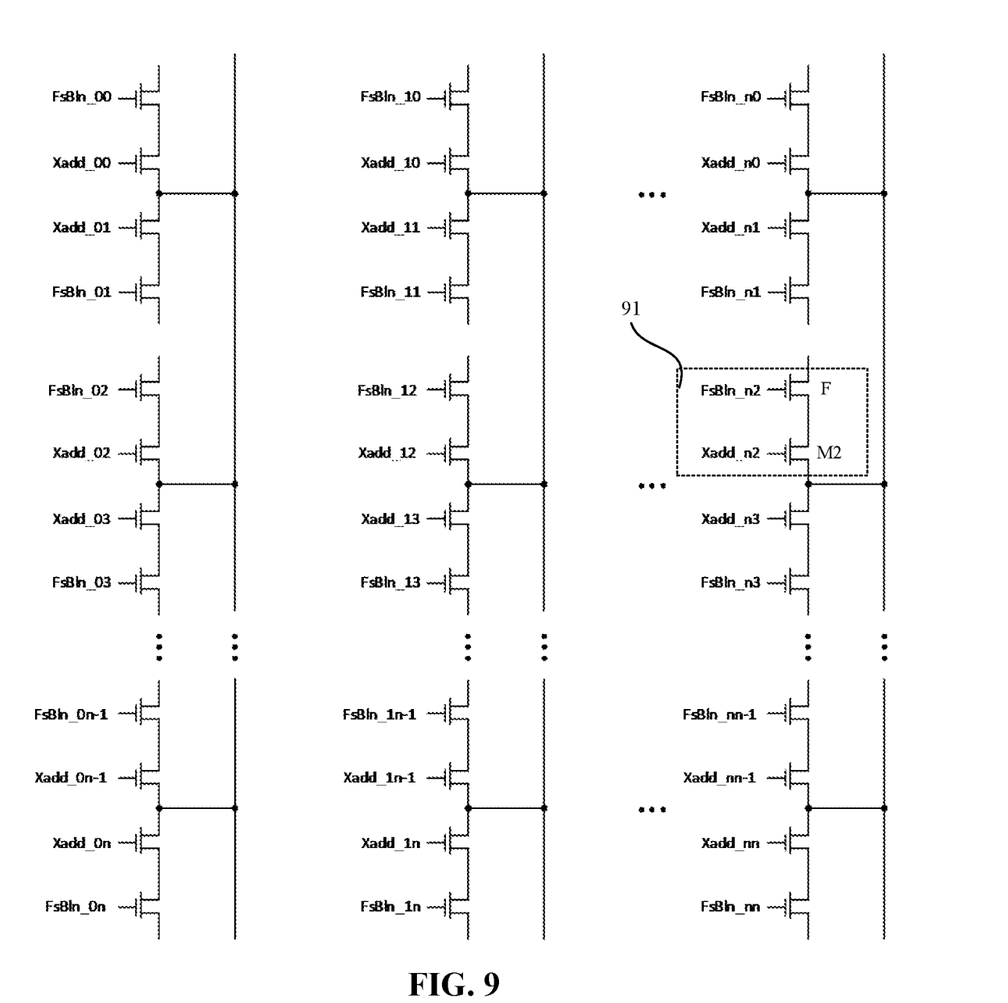
FIG. 9 is a schematic diagram of an anti-fuse memory cell in embodiments of the disclosure.

The anti-fuse memory cell sub-array includes a plurality of anti-fuse memory cells. The controller CON detects states of the plurality of anti-fuse memory cells one by one by switching on or off the first switching element M1. Referring to FIG. 9 to see a structure of the anti-fuse memory cell array 21 and a structure of the anti-fuse memory cell sub-array shown in FIG. 2, 3 anti-fuse memory cell sub-arrays are illustrated in FIG. 9 and correspond to 3 bit lines. Each anti-fuse memory cell sub-array includes a plurality of anti-fuse units 91. Each anti-fuse unit 91 includes one second switching element M2 and one anti-fuse element F.

The controller CON includes a control logic circuit for the second switching element M2 in the anti-fuse memory cell, and also includes a processing logic circuit for further processing an output result of the comparator 22. For example, in FIG. 9, the control logic circuit can enable Xadd_00 to Xadd_nn to be valid one by one, so as to detect states of the anti-fuse elements F_00 to F_nn one by one. The processing logic circuit can perform redundant replacement and other operations by using the states of F_00 to F_nn.

Figure 3:
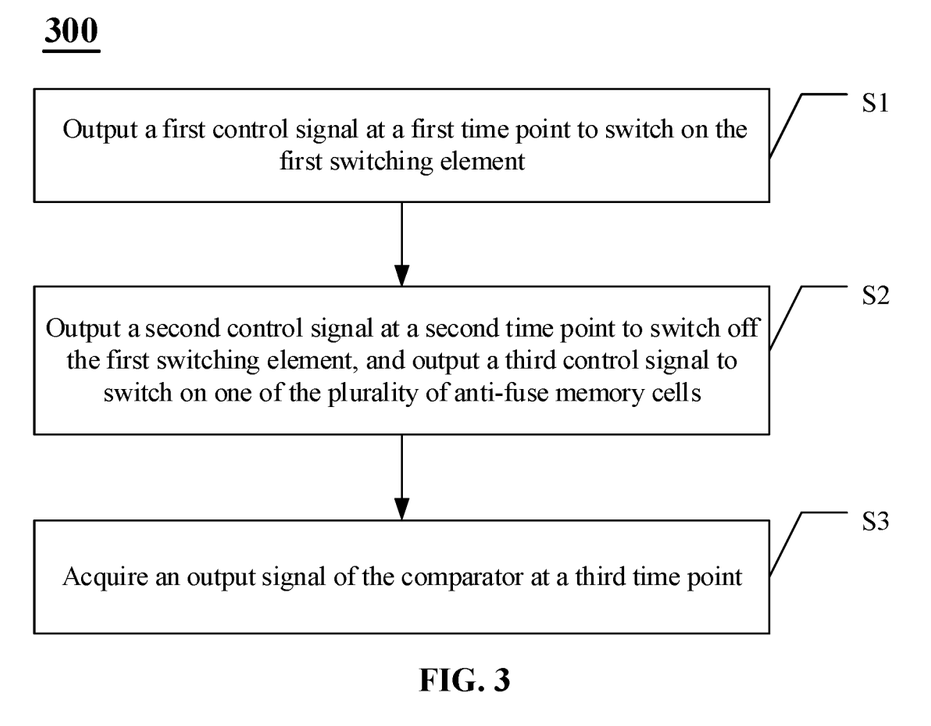
FIG. 3 is a flowchart of a detection method applied to a controller CON of a circuit shown in FIG. 2.

FIG. 3 is a flowchart of a detection method applied to a controller CON of a circuit shown in FIG. 2.

Referring to FIG. 3, the controller CON can be configured to implement the detection method 300. The detection method 300 can include the following steps.

At step S1, a first control signal is output at a first time point to switch on the first switching element.

At step S2, a second control signal is output at a second time point to switch off the first switching element, and a third control signal is output to switch on one of the plurality of the anti-fuse memory cells.

At step S3, an output signal of the comparator is acquired at a third time point.

The third time point is later than the second time point, and the second time point is later than the first time point.

When the first switching element is a P-type transistor, the first control signal is a low level signal, and a second control signal is a high level signal. When the first switching element is an N-type transistor, the first control signal is a high level signal, and a second control signal is a low level signal. When the first switching element is an element of other types, the first control signal and the second control signal can also be a signal of other types. The disclosure does not have a special limitation to this.

Figure 4:
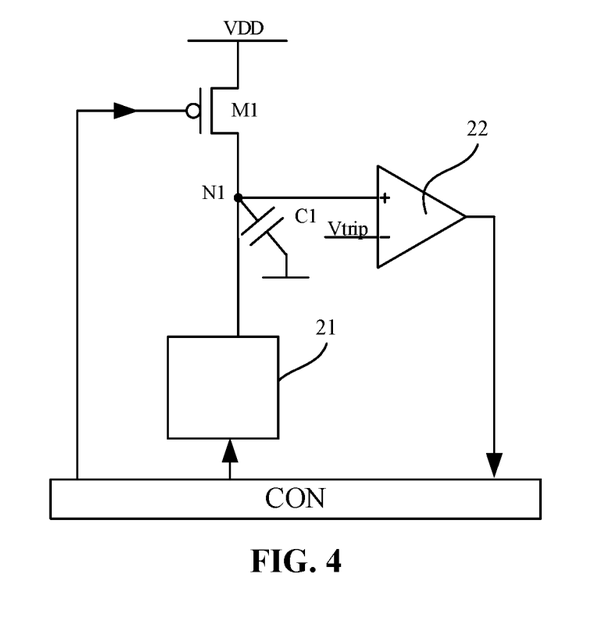
FIG. 4 is a schematic diagram of an equivalent circuit of a circuit shown in FIG. 2.

FIG. 4 is a schematic diagram of an equivalent circuit of a circuit shown in FIG. 2. The control method of FIG. 3 will be explained below with reference to FIG. 2 to FIG. 4.

Referring to FIG. 4, in the embodiments of the disclosure, states of the memory cells are detected by a pre-charging method and by using the comparator.

In one embodiment, a voltage of the first node N1 can be detected by using a parasitic capacitor C1 of the first node N1.

After the first switching element is controlled to be switched on by the first control signal at the first time point, the power supply VDD reaches the first node N1 by means of the first switching element M1. The voltage of the first node N1 is maintained at the power supply VDD under the influence of the parasitic capacitor C1. This process can be regarded as precharging the parasitic capacitor C1.

After the first switching element is controlled to be switched off by the second control signal at the second time point, and a word line corresponding to an anti-fuse memory cell to be tested is controlled by means of a third control signal, the voltage of the first node N1 is discharged through a resistor of the anti-fuse memory cell to be tested. A discharging rate is in inverse proportion to a resistance of the resistor of the anti-fuse memory cell to be tested. That is, if the anti-fuse memory cell to be tested is in a breakdown state, the resistance is relatively low, and the discharging rate is relatively large. If the anti-fuse memory cell to be tested is not in a breakdown state, the resistance is relatively high, and the discharging rate is relatively small.

It can be understood that the second control signal can be provided earlier than the third control signal, or can be provided at the same time as the third control signal to prevent the power supply VDD from continuing to charge the first node N1 through the first switching element M1 in an on state during discharging of a passage.

A method for acquiring the output signal of the comparator 22 can be either to read the output signal of the comparator 22 at the third time point, or to control the comparator 22 by an enable pin of the comparator 22 to be in a disable state when the first switching element M1 is switched on and be switched to an enable state at the third time point to output a comparison result between the voltage of the first node N1 and the reference voltage Vtrip.

The voltage of the first node N1 is detected at the third time point by using the comparator 22 and the reference voltage Vtrip to obtain a storage state of the anti-fuse memory cell to be tested. A proper reference voltage and a proper comparator are used for detection at a proper time point, so that the flip point of the comparator can be accurately controlled to prevent an error in detection of a storage state caused by a resistance offset or an offset of a flip point of a logic gate. Therefore, in the embodiments of the present disclosure, selection of the third time point and setting of a voltage value of the reference voltage Vtrip are important means for realizing accurate detection.

Figure 5:
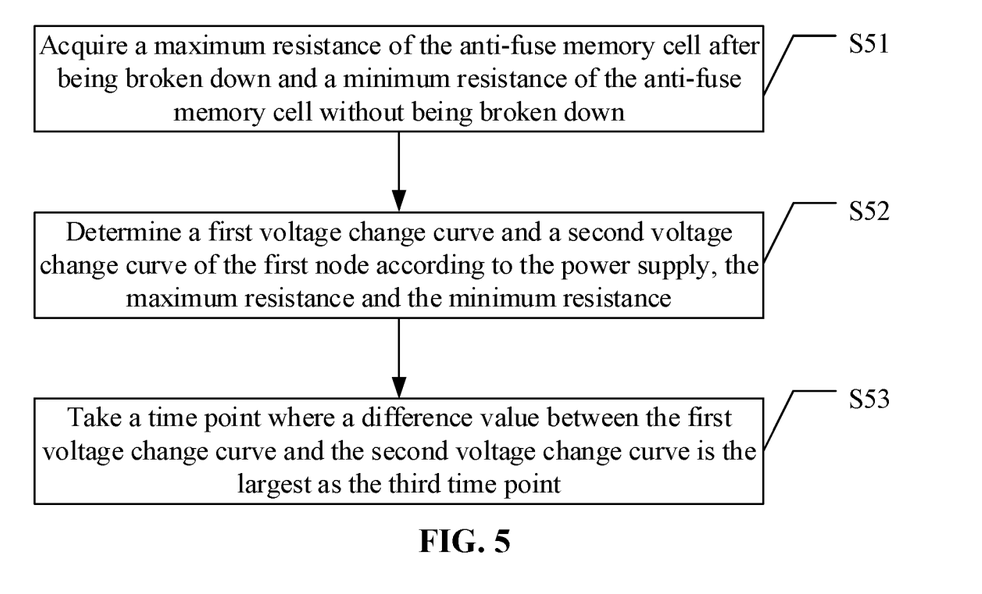
FIG. 5 is a schematic diagram of a method for determining a third time point in embodiments of the disclosure.

FIG. 5 is a schematic diagram of an approach for determining a third time point in the embodiments of the disclosure.

Referring to FIG. 5, in one exemplary embodiment of the disclosure, the third time point can be determined according to the following approaches.

At step S51, a maximum resistance of the anti-fuse memory cell after being broken down and a minimum resistance of the anti-fuse memory cell without being broken down.

At step S52, a first voltage change curve and a second voltage change curve of the first node are determined according to the power supply, the maximum resistance and the minimum resistance.

At step S53, a time point where a difference value between the first voltage change curve and the second voltage change curve is the largest is used as the third time point.

In the embodiments of the disclosure, a difference value between the second time point T2 and the first time point T1 is related to a capacitance of the parasitic capacitor C1. If the capacitance of the parasitic capacitor C1 is larger, it takes longer time for the voltage of the first node N1 to reach VDD, and the difference value between T2 and T1 is larger. If the capacitance of the parasitic capacitor C1 is smaller, it takes shorter time for the voltage of the first node N1 to reach VDD, and the difference value between T2 and T1 is smaller. When the difference value between T2 and T1 is extremely small, it can be ignored, considering that T2 and T1 are equal.

The difference value between the third time point T3 and the second time point T2 is related to the difference value between the first voltage change curve and the second voltage change curve.

Figure 6:
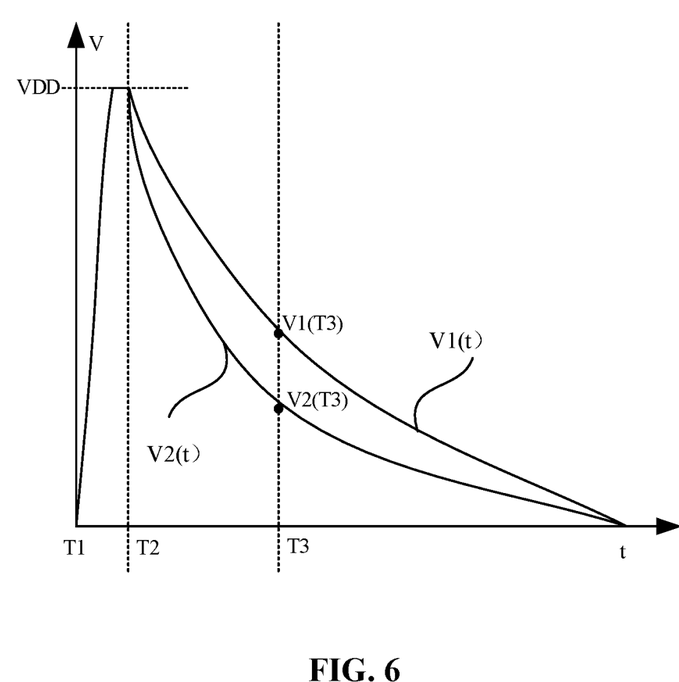
FIG. 6 is a schematic diagram of a first voltage change curve and a second voltage change curve.

FIG. 6 is a schematic diagram of a first voltage change curve and a second voltage change curve.

When the minimum resistance of the anti-fuse memory cell without being broken down is R1, and the maximum resistance of the anti-fuse memory cell after being broken down is R2, R1 can be obtained by detecting the resistances of the plurality of anti-fuse memory cells when they are not broken down, and R2 can be obtained by detecting resistances of the plurality of anti-fuse memory cells after breakdown. Both of the above-mentioned R1 and R2 are statistical results. R1 and R2 are statistically analyzed in the research, development and production processes of anti-fuse memory cells, so as to determine specific values of R1 and R2.

Referring to FIG. 6, when a passage resistance includes R1, the first voltage change curve where the voltage V1(t) of the first node N1 varying with time is decreased from VDD at the second time point T2 is:

$$V1(t) = VDD * e^{\frac{-t}{R1C1}} \tag{1}$$

When a passage resistance includes R2, the second voltage change curve where the voltage V2(t) of the first node N1 varying with time is decreased from VDD at the second time point T2 is:

$$V2(t) = VDD * e^{\frac{-t}{R2C1}} \tag{2}$$

The difference value between the first voltage change curve and the second voltage change curve is:

$$\Delta V(t) = V1(t) - V2(t) = VDD * \left(e^{\frac{-t}{R1C1}} - e^{\frac{-t}{R2C1}}\right) \tag{3}$$

It can be seen from FIG. 6 that the $\Delta V(t)$ voltage increases first and then decreases with the time t. In order to determine the maximum value of $\Delta V(t)$, it is set:

$$\frac{d\Delta V(t)}{dt} = 0 \tag{4}$$

so that a time point T3 where the difference value $\Delta V(t)$ between the first voltage change curve and the second voltage change curve is the largest can be obtained. It can be seen from FIG. 6 that the difference value between T3 and T2 is determined if R1, R2, VDD, and T2 are determined.

In one exemplary embodiment of the disclosure, the reference voltage Vtrip can also be determined according to the curves shown in FIG. 6. A first voltage value V1(T3) of the first voltage change curve V1(t) at the third time point T3 and a second voltage value V2(T3) of the second voltage change curve V2(t) at the third time point T3 can be determined first. Then, an average value of the first voltage value V1(T3) and the second voltage value V2(T3) is set as the reference voltage Vtrip, i.e.:

$$Vtrip = \frac{V1(T3) + V2(T3)}{2} \tag{5}$$

The third time point T3 for detecting the output signal of the comparator and the reference voltage Vtrip for controlling the flip point of the comparator are determined by the above method, such that a more accurate detection result can be obtained when the output signal of the comparator is detected, and the detection accuracy is effectively improved.

Figure 7:
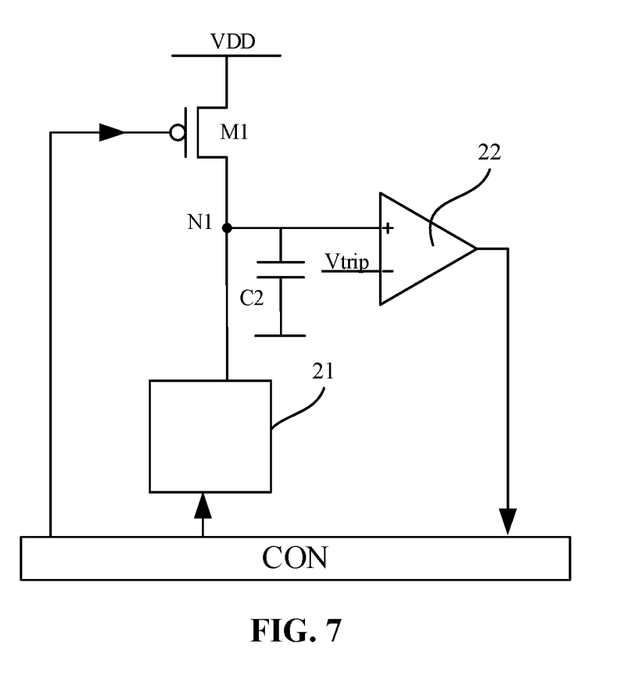
FIG. 7 is a schematic structural diagram of a state detection circuit of an anti-fuse memory cell in another embodiment of the disclosure.

FIG. 7 is a schematic structural diagram of a state detection circuit of an anti-fuse memory cell in another embodiment of the disclosure.

Referring to FIG. 7, in order to reduce a random deviation of a discharging curve caused by a deviation of the parasitic capacitor of the first node N1, one additional capacitor C2 can be added for the first node N1. That is, the detection circuit 200 can further include:

a detection capacitor C2, a first end of which is connected to the first node N1 and a second end of which is grounded.

The function of the detection capacitor C2 is the same as the parasitic capacitor C1, and both of them are for detecting the voltage of the first node N1. When it is detected that a difference between the capacitance of the detection capacitor C2 and the capacitance of the parasitic capacitor C1 is relatively large, the equivalent capacitor connected to the first node N1 is regarded as the detection capacitor C2. At this time, C1 involved in formula (1) to (5) can be replaced by C2.

Figure 8:
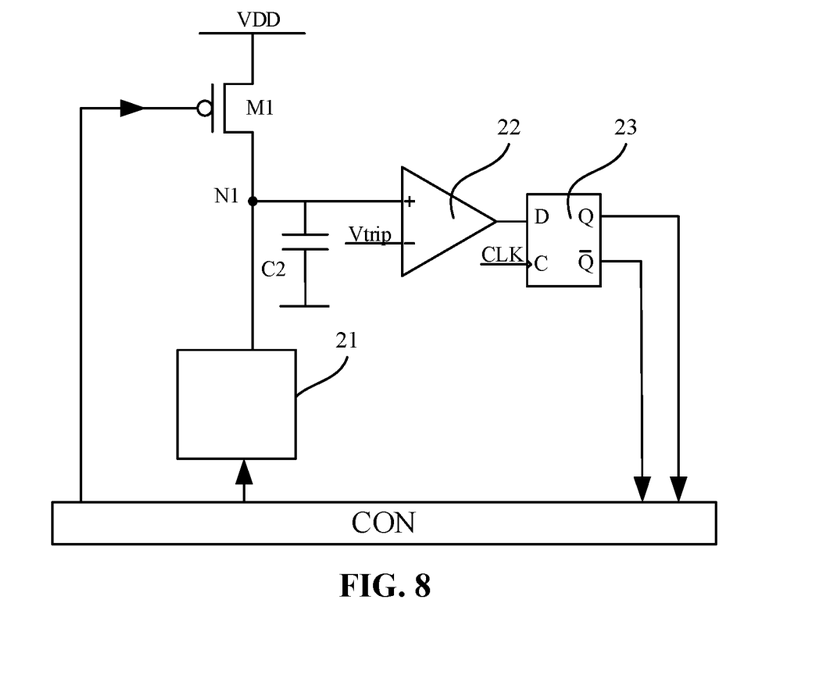
FIG. 8 is a schematic structural diagram of a state detection circuit of an anti-fuse memory cell in a yet another embodiment of the disclosure.

FIG. 8 is a schematic structural diagram of a state detection circuit of an anti-fuse memory cell in yet another embodiment of the disclosure.

Referring to FIG. 8, in other embodiments of the disclosure, the detection circuit 200 can further include:

a flip-flop 23. An input end of the flip-flop 23 is connected to an output end of the comparator 22. A first output end and a second output end of the flip-flop 23 are both connected to the controller CON.

The flip-flop 23 can be, for example, a D flip-flop and used to latch an output signal of the comparator 22 for the controller CON to read. Those skilled in the art can set the type of the flip-flop 23 by self. The disclosure does not limit this.

It can be understood that the setting of the detection capacitor C2 or the flip-flop 23 does not affect the implementation of the control method shown in FIG. 3, and does not affect a selection logic of the third time point and the reference voltage.

FIG. 9 is a schematic diagram of an anti-fuse memory cell in the embodiments of the disclosure.

Referring to FIG. 9, the anti-fuse memory cell 91 can include:

a second switching element M2, a first end of which being used as a bit line of the anti-fuse memory cell 91; and an anti-fuse element F, a first end of which being connected to a second end of the second switching element M2.

A control end of the second switching element M2 and a control end of the anti-fuse element F are both connected to the controller.

Figure 10:
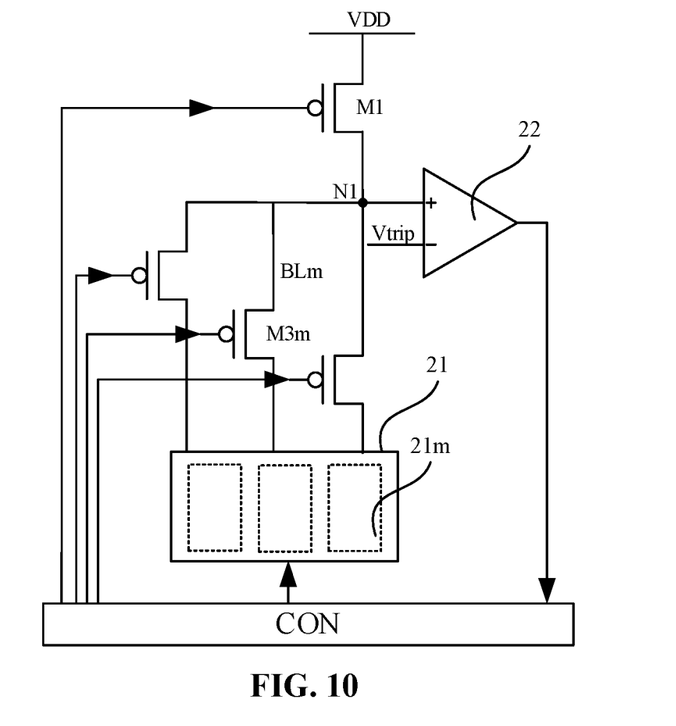
FIG. 10 is a schematic structural diagram of a state detection circuit of an anti-fuse memory cell in yet another embodiment of the disclosure.

FIG. 10 is a schematic structural diagram of a state detection circuit of an anti-fuse memory cell in yet another embodiment of the disclosure.

Referring to FIG. 10, in one embodiment, the first node N1 can be used to connect a plurality of bit lines. The anti-fuse memory cell array 21 can include:

a plurality of anti-fuse memory cell sub-arrays 21$m$ (m is a bit line sequence number), each anti-fuse memory cell sub-array 21$m$ corresponding to one bit line BLm, and each anti-fuse memory cell sub-array 21$m$ including a plurality of anti-fuse memory cells;

a plurality of third switching elements M3$m$ corresponding to the anti-fuse memory cell sub-arrays 21$m$, a first end of each third switching element M3$m$ being connected to the bit line BLm of the corresponding anti-fuse memory cell sub-array 21$m$, a second end of each third switching element M3$m$ being connected to the first node N1, and a control end of each third switching element M3$m$ being connected to the controller CON. A default state of the third switching element M3$m$ is an off state.

Each anti-fuse memory cell sub-array 21$m$ can include 16 anti-fuse memory cells connected to one bit line, for example, i.e., one column of anti-fuse memory cells. In some embodiments, one bit line corresponds to one first switching element M1 and one comparator 22.

By means of connecting the plurality of anti-fuse memory cell sub-arrays 21$m$ to the first node, a storage state of each anti-fuse memory cell in the plurality of anti-fuse memory cell sub-arrays 21$m$ can be detected. An exemplary approach is as shown in FIG. 11.

Figure 11:
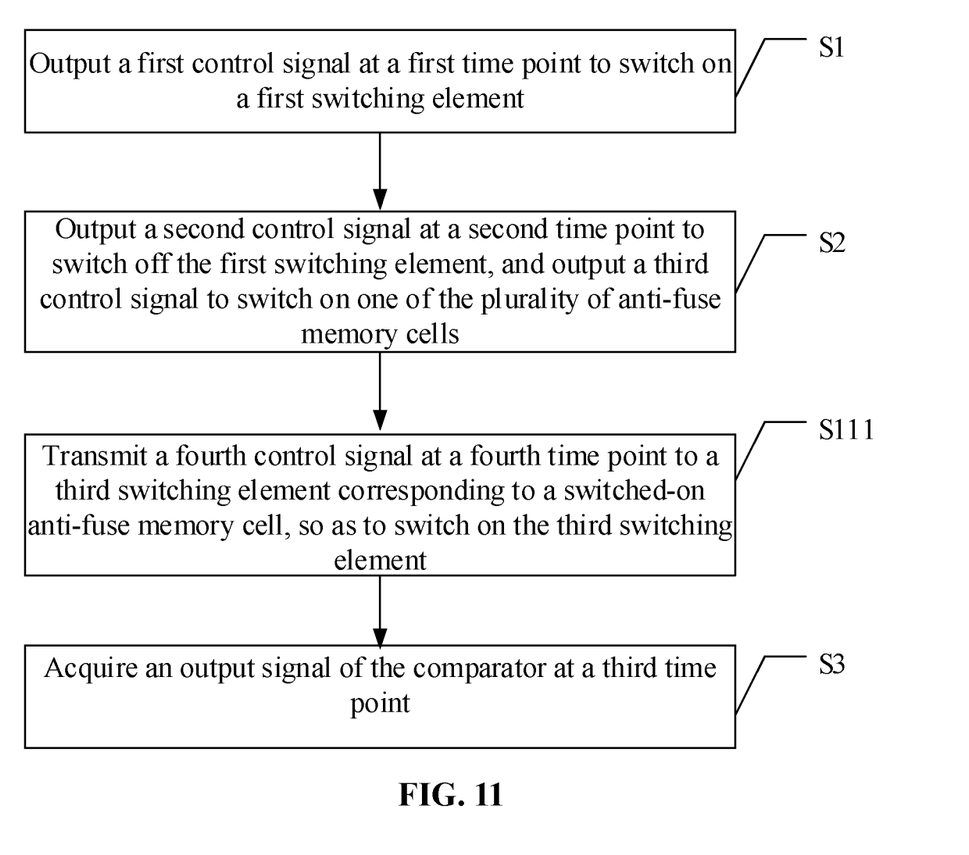
FIG. 11 is a flowchart of a detection method corresponding to a circuit shown in FIG. 10.

FIG. 11 is a flowchart of a detection method corresponding to a circuit shown in FIG. 10.

Referring to the circuit shown in FIG. 10, the controller CON can be configured to implement the following method.

At step S1, a first control signal is output at a first time point to switch on the first switching element.

At step S2, a second control signal is output at a second time point to switch off the first switching element, and a third control signal is output to switch on one of the plurality of anti-fuse memory cells.

At step S111, a fourth control signal is transmitted at a fourth time point to a third switching element corresponding to a switched-on anti-fuse memory cell, so as to switch on the third switching element.

At step S3, an output signal of the comparator is acquired at a third time point.

The fourth time point is later than the first time point and prior to the third time point.

That is, the method shown in FIG. 3 can include step S111. Step S111 and step S2 can be interchanged, or can be executed simultaneously.

In the embodiment shown in FIG. 11, the fourth time point can be either earlier than the second time point or later than the second time point, and can be equal to the second time point, as long as both the fourth time point and the second time point are both between the first time point and the third time point, so that a discharging passage is opened after configuration of the voltage of the first node N1 is completed at the first time point and before the voltage of the first node N1 starts to be detected at the third time point.

When the third switching element is a P-type transistor, the fourth control signal is at a low level. When the third switching element is an N-type transistor, the fourth control signal is at a high level. When the third switching element is an element of other types, the fourth control signal can also be a signal of other types. The disclosure does not have a special limitation to this.

Figure 12:
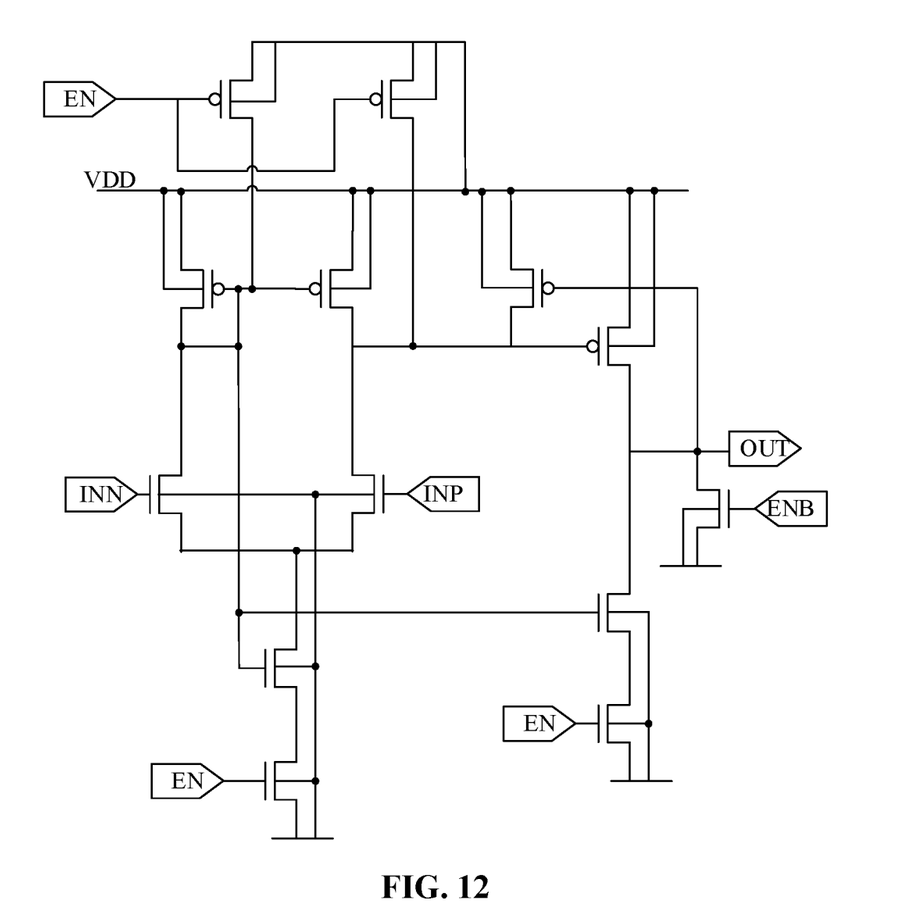
FIG. 12 is a schematic diagram of a comparator in one embodiment of the disclosure.

FIG. 12 is a schematic diagram of a comparator 22 in one embodiment of the disclosure.

Referring to FIG. 12, in one embodiment, a function of the comparator 22 can be realized by using a differential amplifier. A self-bias circuit is used in the comparator 22. In FIG. 12, INN denotes a negative input end of the comparator; INP denotes a positive input end of the comparator; EN denotes an enable end and EnB denotes an inverting input end to the EN. The differential amplifier uses a simple two-stage comparator, so that a flip point can be accurately controlled. Excessive bias current routing is avoided by the self-bias circuit.

According to the anti-fuse memory cell state detection circuit and the anti-fuse memory cell state detection method provided by the embodiments of the disclosure, the parasitic capacitor or the detection capacitor is used to precharge a connection point (the first node) of the first switching element and the anti-fuse memory cell array at the first time point. The resistor of the anti-fuse memory cell to be tested is used to discharge the first node at the second time point. The voltage of the first node is detected at the third time point. The comparator is used to compare the voltage of the first node with the reference voltage, so that an output flip point of the comparator can be accurately controlled. By determining the minimum resistance R1 when the anti-fuse memory cell is not broken down and the maximum resistance R2 after the anti-fuse memory cell is broken down, and then determining the time point where the difference value between the voltage change curves of the first node voltage under R1 and R2 is the largest, the most accurate third time point for state detection can be determined. The average value of the values of the two voltage change curves corresponding to the third time point is used as the reference voltage, such that the output of the comparator is more accurate, and misjudgment of the storage state of the anti-fuse memory cell caused by a resistance offset of the anti-fuse memory cell and a flip voltage offset of the logic gate in the related art is avoided.

According to one aspect of the disclosure, a memory is provided, including any one of the above-mentioned anti-fuse memory cell state detection circuit. The memory can be, for example, a dynamic random-access memory (DRAM).

It should be noted that although several modules or units of the device for action execution are mentioned in the above detailed description, this division is not mandatory. In fact, according to the implementation modes of the disclosure, the features and functions of two or more modules or units described above can be embodied in one module or unit. On the contrary, the features and functions of a module or unit described above can be further embodied by multiple modules or units.

After considering the specification and implementing the disclosure disclosed here, those skilled in the art will easily conceive other implementation solutions of the disclosure. The present application is intended to cover any variations, uses, or adaptive changes of the disclosure. These variations, uses, or adaptive changes follow the general principles of the disclosure and include common general knowledge or conventional technical means in the technical field, which are not disclosed herein. The specification and embodiments are only regarded as exemplary, the true scope and concept of the disclosure are indicated by the claims.

In the embodiments of the disclosure, by means of detecting the voltage of the connection point between the first switching element and the anti-fuse memory cell array, and comparing the voltage with the reference voltage to obtain the resistance value of the current anti-fuse memory cell to be tested in the anti-fuse memory cell array, a voltage flip point for detecting the storage state of the anti-fuse memory cell can be accurately controlled, and the misjudgment of the storage state of the anti-fuse memory cell caused by the resistance offset of the anti-fuse memory cell and the flip voltage offset of the logic gate in the related technologies is avoided.

What is claimed is:

1. A state detection circuit of an anti-fuse memory cell, comprising:
a first switching element, having a first end connected to a power supply, a second end connected to a first node, and a control end connected to a controller;
an anti-fuse memory cell array comprising a plurality of anti-fuse memory cell sub-arrays, bit lines of the plurality of anti-fuse memory cell sub-arrays being all connected to the first node, and word lines of the plurality of anti-fuse memory cell sub-arrays being all connected to the controller; and
a comparator, having a first input end connected to the first node, and a second input end connected to a reference voltage;
wherein the anti-fuse memory cell sub-array comprises a plurality of anti-fuse memory cells; and the controller is configured to detect states of the plurality of anti-fuse memory cells one by one by switching on or off the first switching element,
wherein the controller is further configured to:
output a first control signal at a first time point to switch on the first switching element;
output a second control signal at a second time point to switch off the first switching element, and output a third control signal to switch on one of the plurality of anti-fuse memory cells; and
acquire an output signal of the comparator at a third time point;
wherein the third time point is later than the second time point, and the second time point is later than the first time point, and
wherein the third time point is determined according to following approaches:
acquiring a maximum resistance of the anti-fuse memory cell after being broken down and a minimum resistance of the anti-fuse memory cell without being broken down;
determining a first voltage change curve and a second voltage change curve of the first node according to the power supply, the maximum resistance and the minimum resistance; and
taking a time point where a difference value between the first voltage change curve and the second voltage change curve is the largest as the third time point.

2. The state detection circuit of an anti-fuse memory cell of claim 1, wherein the reference voltage is determined according to following approaches:
determining a first voltage value of the first voltage change curve at the third time point and a second voltage value of the second voltage change curve at the third time point; and
setting an average value of the first voltage value and the second voltage value as the reference voltage.

3. The state detection circuit of an anti-fuse memory cell of claim 1, further comprising a detection capacitor, wherein a first end of the detection capacitor is connected to the first node, and a second end is grounded.

4. The state detection circuit of an anti-fuse memory cell of claim 1, further comprising a flip-flop, wherein an input end of the flip-flop is connected to an output end of the comparator; and a first output end and a second output end of the flip-flop are both connected to the controller.

5. The state detection circuit of an anti-fuse memory cell of claim 1, wherein the anti-fuse memory cell comprises:
a second switching element, having a first end connected to the bit line of the anti-fuse memory cell;
an anti-fuse element, having a first end connected to a second end of the second switching element;
a control end of the second switching element and a control end of the anti-fuse element are both connected to the controller.

6. The state detection circuit of an anti-fuse memory cell of claim 1, wherein the comparator is in a disable state when the first switching element is switched on.

7. The state detection circuit of an anti-fuse memory cell of claim 6, wherein the comparator adopts a self-bias circuit.

8. A memory device, comprising the state detection circuit of an anti-fuse memory cell of claim 1.

9. The state detection circuit of an anti-fuse memory cell of claim 1, wherein a plurality of third switching elements correspond to the plurality of anti-fuse memory cell sub-arrays, a first end of each third switching element is connected to a bit line of a corresponding anti-fuse memory cell sub-array, a second end of each third switching element is connected to the first node, and a control end of each third switching element is connected to the controller.

10. The state detection circuit of an anti-fuse memory cell of claim 9, wherein the controller is further configured to:
transmit a fourth control signal at a fourth time point to a third switching element corresponding to a switched-on anti-fuse memory cell to switch on the third switching element.

11. The state detection circuit of an anti-fuse memory cell of claim 10, wherein the fourth time point is later than the first time point and prior to the third time point.

\* \* \* \* \*